United States Patent [19]
Tanaka et al.

[11] Patent Number: 5,963,055
[45] Date of Patent: Oct. 5, 1999

[54] INTERFACE CIRCUIT BETWEEN DIFFERENT POTENTIAL LEVELS

[75] Inventors: Yasunori Tanaka; Ikue Yamamoto, both of Tokyo, Japan

[73] Assignee: Kabushiki Kaisha Toshiba, Kawasaki, Japan

[21] Appl. No.: 08/810,117

[22] Filed: Feb. 25, 1997

[30] Foreign Application Priority Data

Mar. 8, 1996 [JP] Japan ................................. P8-52087

[51] Int. Cl.⁶ .......................................... H03K 19/0185
[52] U.S. Cl. ................................. 326/81; 326/83; 326/86
[58] Field of Search .................................. 326/68, 80, 81, 326/83, 86, 119, 121

[56] References Cited

U.S. PATENT DOCUMENTS

| | | | |
|---|---|---|---|
| 4,782,250 | 11/1988 | Adams et al. | 307/473 |
| 4,884,165 | 11/1989 | Kong et al. | 326/86 |
| 5,243,571 | 9/1993 | Brossard | 326/86 |
| 5,381,062 | 1/1995 | Morris | 326/68 |
| 5,534,795 | 7/1996 | Wert et al. | 326/81 |
| 5,546,020 | 8/1996 | Lee et al. | 326/83 |
| 5,565,794 | 10/1996 | Porter | 326/81 |
| 5,635,861 | 6/1997 | Chan et al. | 326/81 |
| 5,721,508 | 2/1998 | Rees | 326/81 |
| 5,729,157 | 3/1998 | Monk et al. | 326/80 |

FOREIGN PATENT DOCUMENTS

| | | |
|---|---|---|
| 64-72618 | 3/1989 | Japan . |
| 7-86910 | 3/1995 | Japan . |

*Primary Examiner*—Jon Santamauro
*Assistant Examiner*—Don Phu Le
*Attorney, Agent, or Firm*—Foley & Lardner

[57] ABSTRACT

A semiconductor output circuit serves as an interface circuit between LSIs having a high and a low supply voltages. The output circuit has at least a pre-buffer and an output stage circuit. The output stage circuit has a pull-up n-channel transistor arranged between an output pad and a low-voltage power source. The output pad may receive a high voltage from an external circuit, or the LSI operating with high supply voltage. The pre-buffer applies a voltage in the range of a ground voltage and a high voltage to the gate of the pull-up transistor, to turn on and off the pull-up transistor. The output stage circuit further has a reverse current prevention circuit formed between and connected to the low-voltage power source and the pull-up transistor, to block a reverse current flowing from the output pad to the low-voltage power source when the high voltage is applied to the output pad.

5 Claims, 14 Drawing Sheets

INTERFACE CIRCUIT BETWEEN DIFFERENT POTENTIAL LEVELS

BACKGROUND OF THE INVENTION

1. Field of the Invention

The present invention relates to a semiconductor output circuit serving as an interface circuit between LSIs operating with different supply voltages and to a computer system employing the semiconductor output circuit.

2. Description of the Prior Art

Given the increasing demands of portable applications and the increased complexity and density associated with scaled LSIs, the need to control power dissipation and power consumption has become essential. This requires the LSI to operate with lower supply voltages. The tendency of the reduction of operation voltages of LSIs will rise further from 3, 2 to 1 Volt or sub 1 Volt in the future. During a migration period of the operating voltages of LSIs, such as going from 5 Volts to 3 Volts, or from 3 Volts to 2 Volts, a mixture of LSIs operating with different supply voltages will be used, and there is a need of an interface circuit mediating between the different operation voltages. For example, there is a need of an interface circuit for bridging a 5-V circuit and a 3-V circuit.

FIG. 1 shows a semiconductor output circuit serving as an interface circuit according to a first prior art. The circuit has a pre-buffer 201 for driving and inverting an input signal IN. The output of the pre-buffer 201 is connected to a node N201, which is connected to the gate of an enhancement-type (E-type) p-channel MOS transistor 202. Any p-channel MOS transistor is referred to as "pMOS" in this specification. The source and substrate of the pMOS 202 are connected to a low-voltage power source VCC for providing 3 V, and the drain thereof is connected to a node N202. The pMOS 202 serves as a pull-up circuit for providing the node N202 with 3 V. The term "substrate" in this specification is used to explain an equivalent circuit of a semiconductor circuit and is not always equal to the substrate of an actual semiconductor chip. It may sometimes correspond to a well (n-well) formed in the real substrate of the semiconductor chip. A depletion-type (D-type) n-channel MOS transistor 203 is formed between the node N202 and an output pad 204. Any n-channel MOS transistor is referred to as "nMOS" in this specification. The gate of the nMOS 203 is connected to the power source VCC, the drain (or source) thereof to the node N202, the source (or drain) thereof to the output pad 204, and the substrate thereof to the ground. The output pad 204 is connected to a bus line 210, and the output pad 204 may receive a high voltage of 5 V. Therefore, the semiconductor output circuit is tolerant to 5 V. As mentioned above, the "substrate" of the nMOS 203 is not always equal to the substrate of an actual semiconductor chip. It may correspond to a p-well in the chip.

The operation of the circuit of FIG. 1 that provides a 3-V output and is tolerant to 5 V will be explained. If the output pad 204 is at the low voltage of 3 V and the input signal IN represents "1", the node N201 provides 0 V to demonstrate a pull-up state by the pMOS 202. The gate of the pMOS 202 is negatively biased with respect to the source thereof, to turn on the pMOS 202. The node N202 receives 3 V to turn on the nMOS 203 because the nMOS 203 is of D-type. The nMOS 203 transfers the voltage at the node N202 to the output pad 204.

If the nMOS 203 is of E-type, it will have a gate threshold voltage Vth to drop the voltage transferred to the output pad 204 to "3V−Vth" (three volts minus Vth). However, the nMOS 203 of FIG. 1 is of D-type, and therefore, Vth is 0. Accordingly, there is no drop in the voltage transferred to the output pad 204.

If the output pad 204 receives the high voltage of 5 V from the bus line 210, the gate of the nMOS 203 is reversely biased, to turn off the nMOS 203. Then, the node N202 can not increase over 3 V, which is equal to the gate voltage of the nMOS 203. Accordingly, the high voltage of 5 V in the bus line 210 never causes a current to reversely flow from the output pad 204 to the low-voltage power source VCC.

The problem of the first prior art will be explained. The nMOS 203 is of D-type to fully provide the output pad 204 with the voltage of the low-voltage power source VCC (3 V). Compared with the E-type nMOS, the D-type nMOS additionally involves a channel doping ion implantation process to control the gate threshold voltage Vth. This increases the cost thereof. The output voltage of the nMOS 203 is 3 V, but this output voltage is provided by a limiting state of the nMOS 203 near the gate threshold condition thereof. Accordingly, the nMOS 203 has low driving capability when providing an output current representing "1" level.

FIG. 2A shows a semiconductor output circuit serving as an interface circuit according to a second prior art. This is disclosed in Japanese Unexamined Patent Publication No. 7-86910. An input terminal 221 receives a data signal IN, and an input terminal 222 receives an output enable signal en. The output enable signal en controls the states on the output terminal 230. An OR gate 223 provides an OR of the data signal IN and output enable signal en. An inverter 224 inverts the output enable signal en. An AND gate 225 provides an AND of the inverted enable signal and the data signal IN. An output stage circuit consists of E-type pMOSs 226 and 227 and nMOSs 228 and 229, which are connected in series between a low-voltage power source VCC for providing 3.3 V and a ground. A node between the pMOS 227 and the nMOS 228 is connected to an output terminal 230. The gate of the pull-up pMOS 226 receives the output of the OR gate 223. The gate of the pull-down nMOS 229 receives the output of the AND gate 225. The gate of the nMOS 228 is connected to the power source VCC. The gate of the pMOS 227 is connected to a node N210. E-type nMOSs 231 and 232 are connected in series between the node N210 and the ground. The nMOS 231 has a gate connected to the power source VCC. The nMOS 232 has a gate connected to the output of the inverter 224. An E-type pMOS 233 is formed between the node N210 and the output terminal 230. The pMOS 233 has a gate connected to the power source VCC. The pMOS 226 has a substrate and source both connected to the power source VCC. The nMOSs 228, 229, 231, and 232 have substrates connected to the ground. The pMOSs 227 and 233 have substrates connected to the output terminal 230. The output terminal 230 provides an output signal OUT and is connected to an external bus line 241.

If the output enable signal en represents "0" to indicate an output enabled state and if the data signal IN represents "0", the output terminal 230 provides a signal representing "1". If the data signal IN represents "1", the output terminal 230 provides a signal representing "0". Namely, this circuit carries out an inverting operation. If the output enable signal en represents "1", it is an output disabled state not to drive the bus line 241. In this case, the pMOS 226 and nMOSs 229 and 232 are all turned off, to put the output terminal 230 in a high-impedance state.

If the bus line 241 provides a high voltage of 5 V higher than 3.3 V of the power source VCC under the high-impedance state, the pMOS 233 is turned on. Then, the node N210 becomes the same voltage as the output terminal 230, to completely turn off the pMOS 227 and disconnect a current path between the output terminal 230 and the power source VCC. In this way, the second prior art blocks a reverse current flowing from the bus line 241 to the power source VCC through the output terminal 230.

FIG. 2B is a sectional view showing the reverse current preventing pMOS 227 of FIG. 2A. The substrate of the pMOS 227 is connected to the output terminal 230. As mentioned above, the "substrate" is used to explain the equivalent circuits shown in the figures, and in the actual semiconductor chip of FIG. 2B, corresponds to an n-type well region 227b. More precisely, an n$^+$-type contact region formed in the n-type well is connected to the output terminal 230. When the pMOSs 226 and 227 are turned on in the pull-up operation, a p-type region 227a (source) and the n-type well region 227b (substrate) form a pn diode D1 forwardly biased. As a result, the p-type region 227a, the n-type well region 227b, and a p-type region 227c cause a bipolar operation. This results in passing a large overcurrent from the power source VCC to the ground through the regions 227a, 227b, and 227c, to cause a latch-up fault to break the pMOS 227.

FIG. 3 shows a semiconductor output circuit serving as an interface circuit according to a third prior art. This circuit is disclosed in Japanese Unexamined Patent Publication No. 64-72618. A first input terminal 251 receives an input data signal IN, and a second input terminal 252 receives an output enable signal en. A NAND gate 253 provides a NAND of the data signal IN and the output enable signal en. An inverter 254 inverts the output enable signal en. A NOR gate 255 provides a NOR of the inverted output enable signal and the data signal IN. An input transistor nMOS 256 has a gate to receive the output enable signal $\overline{\text{en}}$ and is connected to an nMOS 257 in series between a node N250 and the ground. The nMOSs 256 and 257 are of E-type. NMOSs and pMOSs are of E-type in this specification unless otherwise specified. An output stage circuit includes a switching transistor pMOS 258, a pull-up transistor pMOS 259, a pass transistor nMOS 260, and a pull-down transistor nMOS 261, which are connected in series between a low-voltage power source VCC of 3.3 V and the ground. The pMOS 258 has a gate connected to the node N250. The pMOS 259 has a gate to receive the output of the NAND gate 253. The nMOS 261 has a gate to receive the output of the NOR gate 255. The nMOS 260 has a gate connected to the power source VCC.

The node N250 is connected to a node between the pMOSs 258 and 259 through a control transistor pMOS 262 having a gate connected to the second input terminal 252. A node between the pMOS 259 and the nMOS 260 is connected to an output terminal 263. An n-well bias transistor pMOS 264 has a gate connected to the output terminal 263, a source connected to the power source VCC, and a drain and substrate connected to an n-well region 270, which is connected to the substrates of the pMOSs 258, 259, and 262. The output terminal 263 is connectable to an external circuit 280.

If the output enable signal en is "1" to indicate an output enabled state and if the input data signal IN is at 3.3 V, the output terminal 263 provides a high voltage representing a first output state. If the input data signal IN is at 0 V with the output enable signal en being "1", the output terminal 263 provides a low voltage representing a second output state. If the external circuit 280 is connected to the output terminal 263, the output enable signal en is set to "0" to put the output terminal 263 in a high-impedance state.

If a high voltage of, for example, 4 V higher than 3.3 V and lower than 5.5 V is applied from the external circuit 280 to the output terminal 263 under the high-impedance state, the pMOS 259 is turned on. Then, the pMOS 262 whose gate is receiving 0 V is also turned on to supply the high voltage from the output terminal 263 to the node N250. This turns off the pMOS 258, thereby blocking a reverse current flowing from the output terminal 263 to the power source VCC.

This third prior art has a possibility of biasing the gate of the pull-up pMOS 259 connected to the output terminal 263 to 0 V even if a high voltage in the range of 3.3 V to 5.5 V is being applied to the output terminal 263. Accordingly, the pMOS 259 needs an extra process for providing a high breakdown voltage structure such as thickening a gate oxide film. This increases the number of manufacturing processes of the circuit of FIG. 3 and complicates the process designing thereof, although this circuit is basically a low-voltage circuit that requires only a low breakdown voltage process.

SUMMARY OF THE INVENTION

An object of the present invention is to provide a high-speed, high-driving-capability semiconductor output circuit serving as an interface circuit capable of simultaneously coping with a hybrid system organization comprising various semiconductor chips operating with high and low supply voltages, and being manufacturable without special or additional processes.

Another object of the present invention is to provide a high-speed, high-driving-capability semiconductor output circuit capable of surely operating with a high latch-up immunity, simultaneously coping with high and low voltage operations, and being manufacturable without special or additional processes.

Still another object of the present invention is to provide a high-speed, high-driving-capability semiconductor output circuit employing low-voltage devices entirely to simultaneously cope with high and low-voltage signal levels without extra processing or special designing.

Still another object of the present invention is to provide a semiconductor output circuit capable of connecting circuits having different power supply voltages (such as optional 5- and 3-V circuits) to each other so that an LSI chip incorporating the semiconductor output circuit and other LSI chips operating with different power supply voltages may be mounted on a single board, thereby making the designing of a complicated system easier and promoting a rapid development of a system having the LSI chips, improving the power dissipation, power consumption, operation speed, etc.

Still another object of the present invention is to provide various computer systems employing semiconductor chips operating with different supply voltages, quickly and flexibly dealing with a migration period of power supply voltages in a developing stage of the computer systems, thereby improving the characteristics such as power dissipation, integration density, and operation speed.

In order to accomplish the objects, a first aspect of the present invention provides a semiconductor output circuit having at least a pre-buffer, an output stage circuit and an output pad. The output pad is so formed that it may receive a high voltage from an external circuit. The pre-buffer amplifies an input voltage. The output stage circuit is formed between and connected to an output pad and a low-voltage power source for providing a low supply voltage that is lower than the high voltage provided by the external circuit. The output stage circuit consists at least of a pull-up transistor to be turned on and off according to the output of the pre-buffer. The pre-buffer provides a voltage in the range of a ground voltage to the high supply voltage. The pull-up transistor may be an enhancement-type (E-type) nMOS having a first electrode directly connected to the output pad and a gate electrode connected to the pre-buffer to receive the output of the pre-buffer. The first electrode is any one of source and drain electrodes. The first aspect forms a reverse current prevention circuit between the low-voltage power source and a second electrode of the pull-up nMOS, where the second electrode is the other of the source and drain electrodes. The reverse current prevention circuit blocks a reverse current flowing from the output pad to the low-voltage power source when the high voltage is applied from the external circuit to the output pad.

The output circuit of the first aspect provides the output pad with a low-voltage output signal according to the input voltage applied to the pre-buffer. And even if the high voltage is applied from the external circuit to the output pad, the reverse current prevention circuit stops a reverse current flowing from the output pad to the low-voltage power source. In a pull-up operation, the gate electrode of the pull-up nMOS receives a deeply enough voltage exceeding the gate threshold condition from the pre-buffer, to realize higher current supplying capability than the first prior art.

The reverse current prevention circuit may be made of an E-type pMOS having a first electrode connected to the low-voltage power source and a second electrode connected to the second electrode of the pull-up nMOS, a pull-down circuit formed between the gate electrode of the pMOS and the ground, and an E-type nMOS having a gate electrode and first electrode commonly connected to the output pad and a second electrode connected to the gate electrode of the pMOS. This structure is simple to operate correctly without a latch-up fault. As mentioned above, pMOSs and nMOSs in this specification are of E-type unless otherwise specified.

A second aspect of the present invention provides a semiconductor output circuit having at least a pull-up pMOS. The pull-up pMOS is formed between and connected to an output pad and a low-voltage power source and is turned on and off in response to an input voltage. The output pad may receive a high voltage from an external circuit operating with high supply voltage. The low-voltage power source provides a low supply voltage that is lower than the high voltage. The output circuit further has a first output potential transfer circuit and a switched floating n-well circuit. The first transfer circuit transfers a voltage at the output pad to the gate electrode of the pull-up pMOS if the voltage at the output pad is higher than a reference level. The switched floating n-well circuit biases the substrate of the pull-up pMOS to the low voltage if the voltage at the output pad is below a predetermined voltage, and to a floating state if the voltage at the output pad is above the predetermined voltage. The term "substrate" is used to explain an equivalent circuit, and the substrate (nominal substrate) of the pull-up pMOS mentioned above may actually correspond to an n-well formed at the surface of a semiconductor substrate (real substrate) of a semiconductor chip.

The output circuit of the second aspect provides the output pad with a low-voltage output signal according to an input voltage. If the output pad receives a voltage higher than the reference level from the external circuit, the first transfer circuit transfers the voltage to the gate electrode of the pull-up pMOS, to turn off the pull-up pMOS. As a result, no reverse current flows from the output pad to the low-voltage power source through the pull-up pMOS. If the voltage at the output pad is higher than the predetermined voltage level (reference level), the switched floating n-well circuit puts the substrate (n-well) of the pull-up pMOS in a floating state, to prevent a reverse current flowing from the output pad to the low-voltage power source through the substrate (n-well) of the pull-up pMOS. The circuit elements in this output circuit can operate entirely on a single low voltage.

The output circuit of the second aspect may further have a pre-buffer and a second output potential transfer circuit for providing a first signal. The first signal enables or disables the pre-buffer. If enabled, the pre-buffer provides the gate electrode of the pull-up pMOS with a voltage in the range of a ground voltage to the low supply voltage. The second transfer circuit disables the pre-buffer if a voltage at the output pad is higher than the reference level, and enables the same if the voltage at the output pad is lower than the reference level. If the voltage at the output pad is higher than the reference level, the first transfer circuit will transfer the high voltage to the gate electrode of the pull-up pMOS. In this case, the second transfer circuit disables the pre-buffer, to block a reverse current flowing from the gate electrode of the pull-up pMOS to the pre-buffer.

According to the second aspect, the pre-buffer may be made of a plurality of pre-buffers, for example, first and second pre-buffers. The first pre-buffer is made of a first pMOS and first and second nMOSs. The first pMOS is formed between the low-voltage power source and an output node of the first pre-buffer. The first pMOS is turned on and off in response to an input voltage. The first and second nMOSs are connected in series between the output node and the ground. The first nMOS has a main electrode (first electrode) connected to the output node and is turned on and off in response to the input voltage complementary to the first pMOS. Namely, the first pMOS and the first nMOS constitute a CMOS inverter. The second nMOS is formed between another main electrode (second electrode) of the first nMOS and the ground. The second nMOS is turned off in response to the first signal from the second transfer circuit. The second pre-buffer has a second pMOS and a third nMOS. The second pMOS has a main electrode (first electrode) connected to the output node of the first pre-buffer and another main electrode (second electrode) and gate electrode connected to the gate electrode of the pull-up pMOS. The third nMOS has a main electrode (first electrode) connected to the output node of the first pre-buffer, another main electrode (second electrode) connected to the gate of the pull-up pMOS, and a gate electrode connected to the low-voltage power source. Here, the first electrode is any one of source and drain electrodes, and the second electrode is the other of them.

If the voltage at the output pad is higher than the reference level, the second transfer circuit provides the first pre-buffer with the first signal to turn off the second nMOS of the first pre-buffer. The voltage at the output pad is passed through the second pre-buffer and is changed to a low voltage thereby. Accordingly, even if the first transfer circuit transfers the high voltage from the output pad to the gate electrode of the pull-up pMOS, the second pre-buffer blocks a reverse current flowing from the gate electrode of the pull-up pMOS to the output node of the first pre-buffer or to the low-voltage power source. According to the second aspect, no transistor receives a voltage higher than the low voltage, and therefore, the output circuit may be formed of low-voltage transistors only.

A third aspect of the present invention provides a semiconductor output circuit having at least a pull-up pMOS. The pull-up pMOS is formed between and connected to an output pad and a low-voltage power source and is turned on and off in response to a signal corresponding to an input voltage. The output pad may receive a high voltage from an external circuit operating with high supply voltage. The low-voltage power source provides a low supply voltage that is lower than the high voltage from the external circuit. The output circuit further has an output potential transfer circuit, a reverse current prevention pMOS, and a switched floating n-well circuit. The transfer circuit provides a first signal if a voltage at the output pad is higher than a reference level. The reverse current prevention pMOS is formed between and connected to the pull-up pMOS and the output pad and is turned off in response to the first signal. The switched floating n-well circuit biases n-well regions for pMOS in the semiconductor output circuit, i.e., a substrate of the reverse current prevention pMOS to the low voltage if the voltage at the output pad is lower than a predetermined voltage, and to a floating state if the voltage at the output pad is higher than the predetermined voltage (or the low voltage).

The output circuit of the third aspect provides the output pad with a low-voltage output signal according to an input voltage. If a voltage at the output pad is higher than the reference level, the switched floating n-well circuit biases the substrate of the reverse current prevention pMOS to a floating state. This prevents a reverse current from flowing to the low-voltage power source through the substrate of the reverse current prevention pMOS. At the same time, the first signal from the transfer circuit turns off the reverse current prevention pMOS, not to transfer the high voltage from the output pad to the pull-up pMOS. Namely, no reverse current flows from the output pad to the low-voltage power source through the pull-up pMOS. According to the third aspect, no transistor receives a voltage higher than the low voltage, and therefore, the output circuit may be formed of low-voltage transistors only without special processes nor intricate process designing.

A fourth aspect of the present invention provides a system having a control LSI incorporating the semiconductor output circuit of any one of the first to third aspects of the present invention and other components connected to the control LSI. The components may include a CPU, memories, and peripheral equipment such as a printer. The potential levels of supply voltages for the memories are optional and are replaceable with another according to the present invention.

The system according to the fourth aspect is easy to design and is capable of coping with a hybrid organization having various LSI chips and memory chips operating with different supply voltages.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 4A:
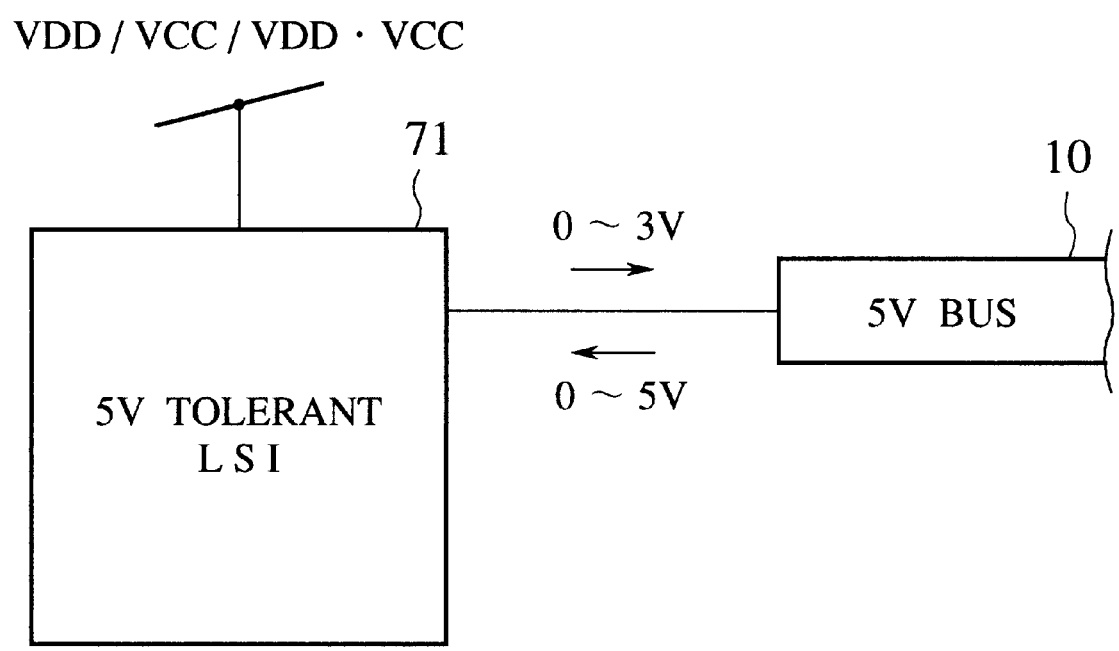
FIG. 4A schematically shows a 5-V-tolerant, 3-V-output semiconductor output circuit according to a first embodiment of the present invention.
Figure 4B:
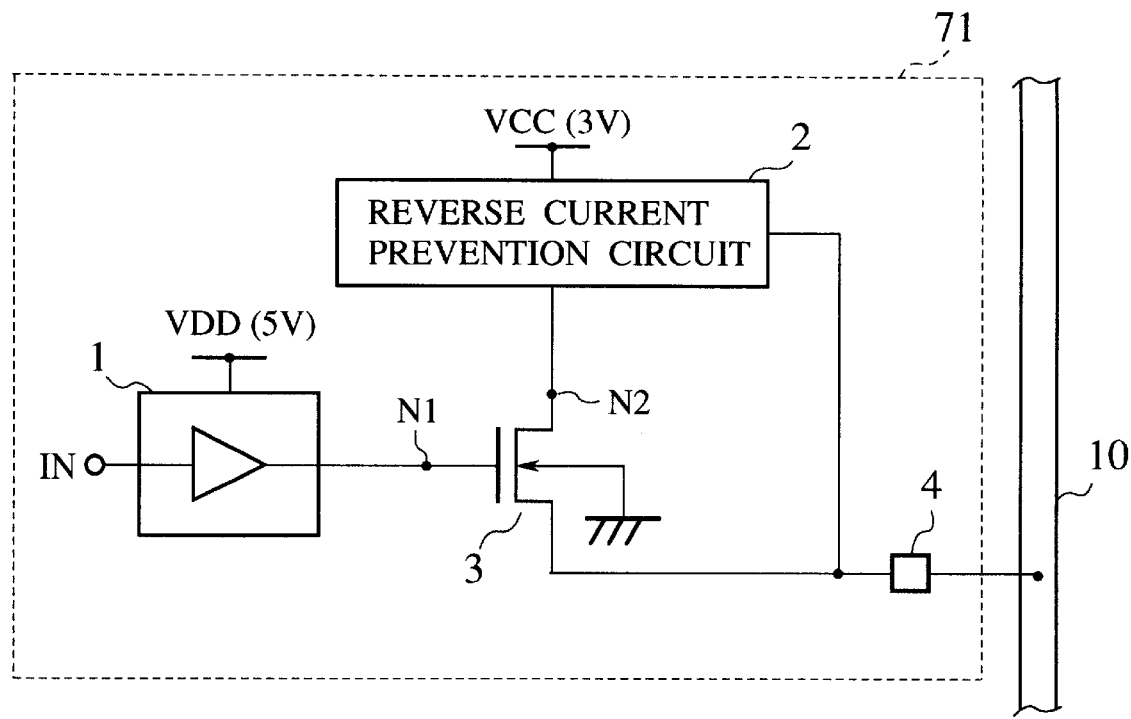
FIG. 4B shows the semiconductor output circuit according to the first embodiment.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Any n-channel MOS transistor and p-channel MOS transistor are abbreviated as nMOS and pMOS in the following explanation and are of enhancement type (E-type) unless otherwise specified.
First Embodiment FIG. 4A shows a semiconductor output circuit 71 serving as an interface circuit according to the first embodiment of the present invention. The circuit 71 is a 5-V-tolerant, 3-V-output circuit which provides a low-voltage output signal in the range of 0 V to 3 V and has output pins connectable to an external 5-V bus 10. The semiconductor output circuit 71 is merged in an LSI chip. FIG. 4B shows the details of the semiconductor output circuit 71. A pre-buffer 1 is connected to a power source VDD for providing 5 V and provides an output voltage in the range of 0 V to 5 V in response to an input voltage IN. An output terminal of the pre-buffer 1 is connected to a node N1, which is connected to an output stage circuit. The output stage circuit includes at least a reverse current prevention circuit 2 and a pull-up nMOS 3. The prevention circuit 2 is formed between and connected to a power source VCC for providing 3V and a node N2. The pull-up nMOS 3 is formed between and connected to the node N2 and an output pad 4.

The pull-up nMOS 3 has a first electrode (source or drain) connected to the output pad 4, a gate electrode connected to the node N1, a second electrode (drain or source) connected to the node N2, and a substrate connected to a ground. The first electrode is any one of main electrodes, i.e., drain and source electrodes, and the second electrode is the other of them. The output pad 4 is connected to the 5-V bus line 10. The prevention circuit 2 blocks a reverse current flowing from the output pad 4 to the power source VCC when a voltage higher than 3 V is externally applied to the output pad 4.

Figure 4C:
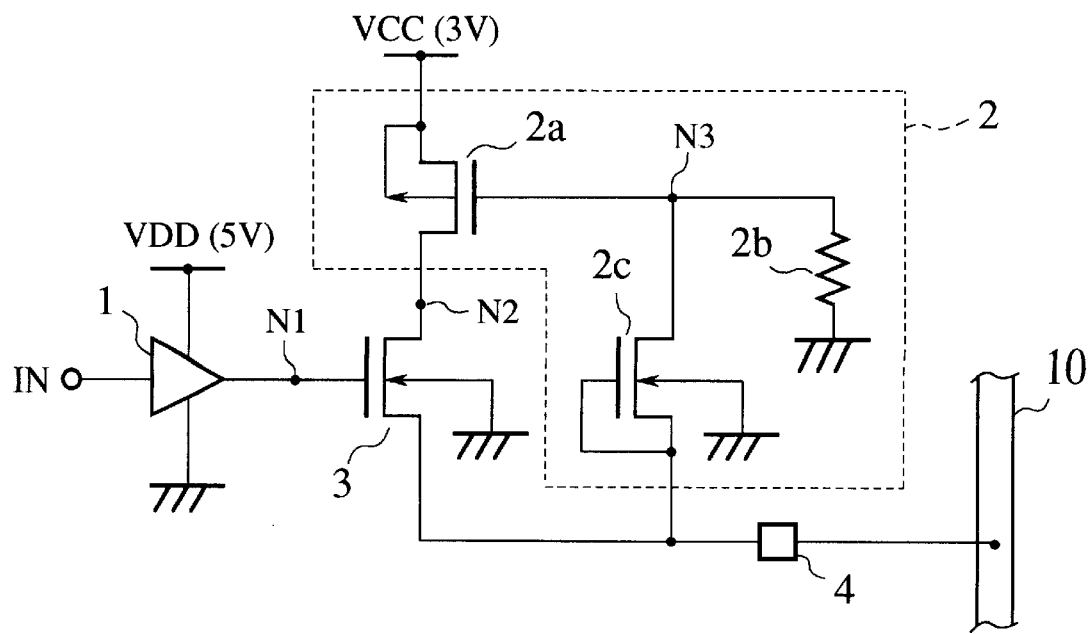
FIG. 4C shows a reverse current prevention circuit contained in the circuit of FIG. 4B.

FIG. 4C shows the details of the prevention circuit 2. The prevention circuit 2 consists of a pMOS 2a, a resistor 2b serving as a pull-down circuit, and an nMOS 2c. The pMOS 2a has a source and substrate connected to the power source VCC and a drain connected to the node N2. The term "substrate" is used to explain the equivalent circuit and may correspond to a well in an actual semiconductor chip. Namely, the "substrate" in this specification is not always equal to an actual substrate of a semiconductor chip. The gate of the pMOS 2a is connected to a node N3, which is grounded through the resistor 2b and is connected to the drain of the nMOS 2c. The nMOS 2c has a gate and source commonly connected to the output pad 4 and a substrate connected to the ground. The pMOS 2a, nMOS 2c, and nMOS 3 are planar MOSFETs whose source and drain electrodes are symmetrical with respect to the gate electrode thereof. Accordingly, the source and drain of a given nMOS or pMOS in this specification are replaceable with each other.

Figure 1:
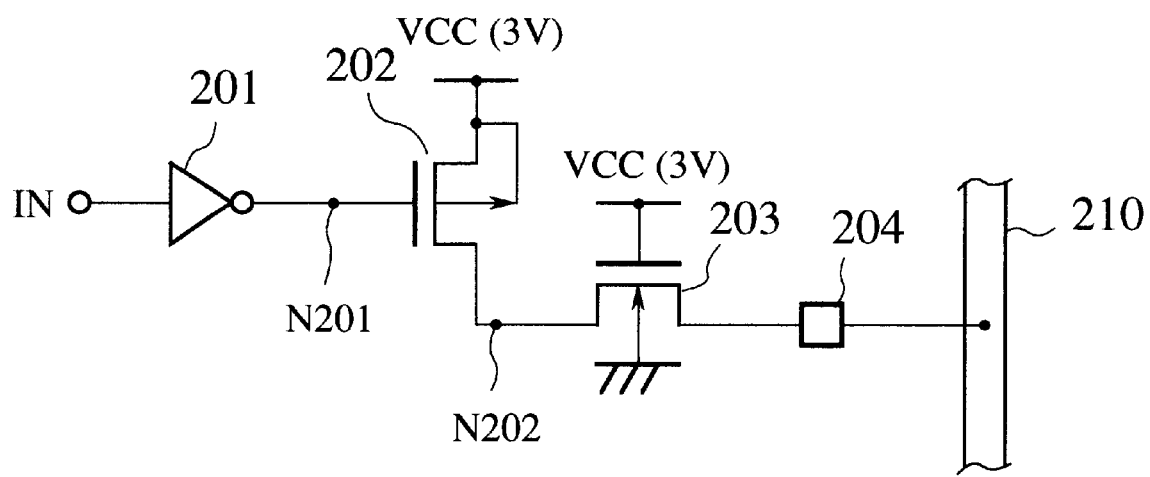
FIG. 1 shows a semiconductor output circuit according to the first prior art.
Figure 2A:
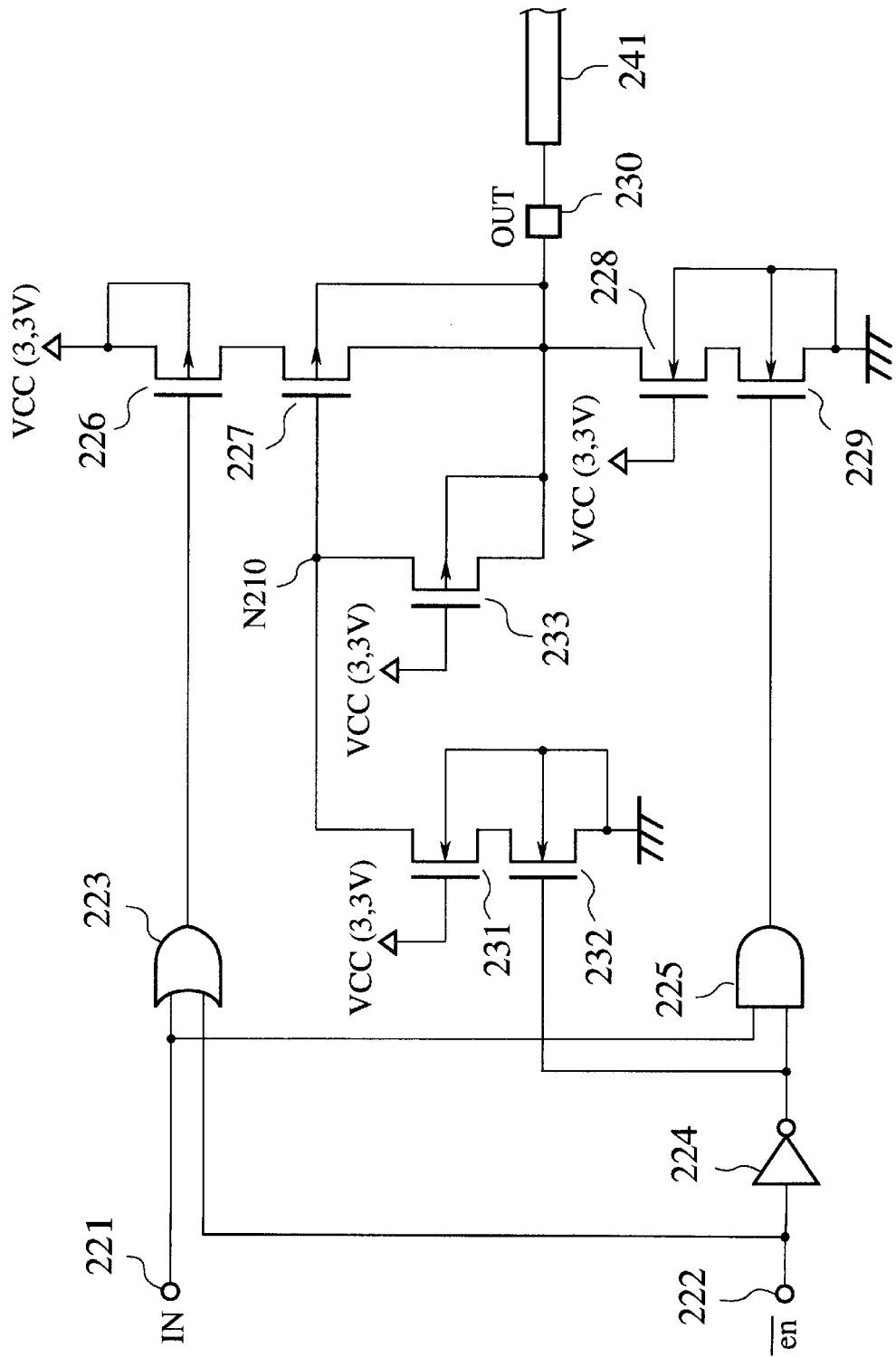
FIG. 2A shows a semiconductor output circuit according to the second prior art.
Figure 2B:
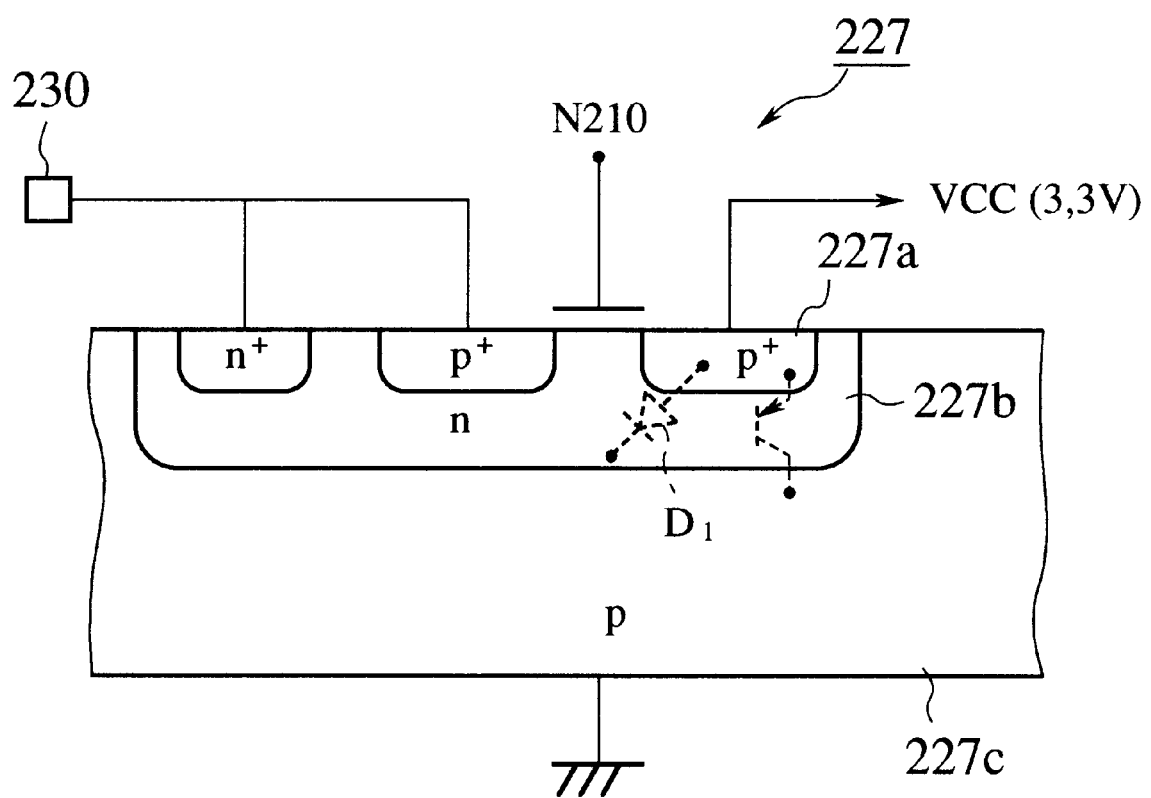
FIG. 2B is a sectional view showing a cross-sectional view of a pMOS 227 of FIG. 2A.
Figure 3:
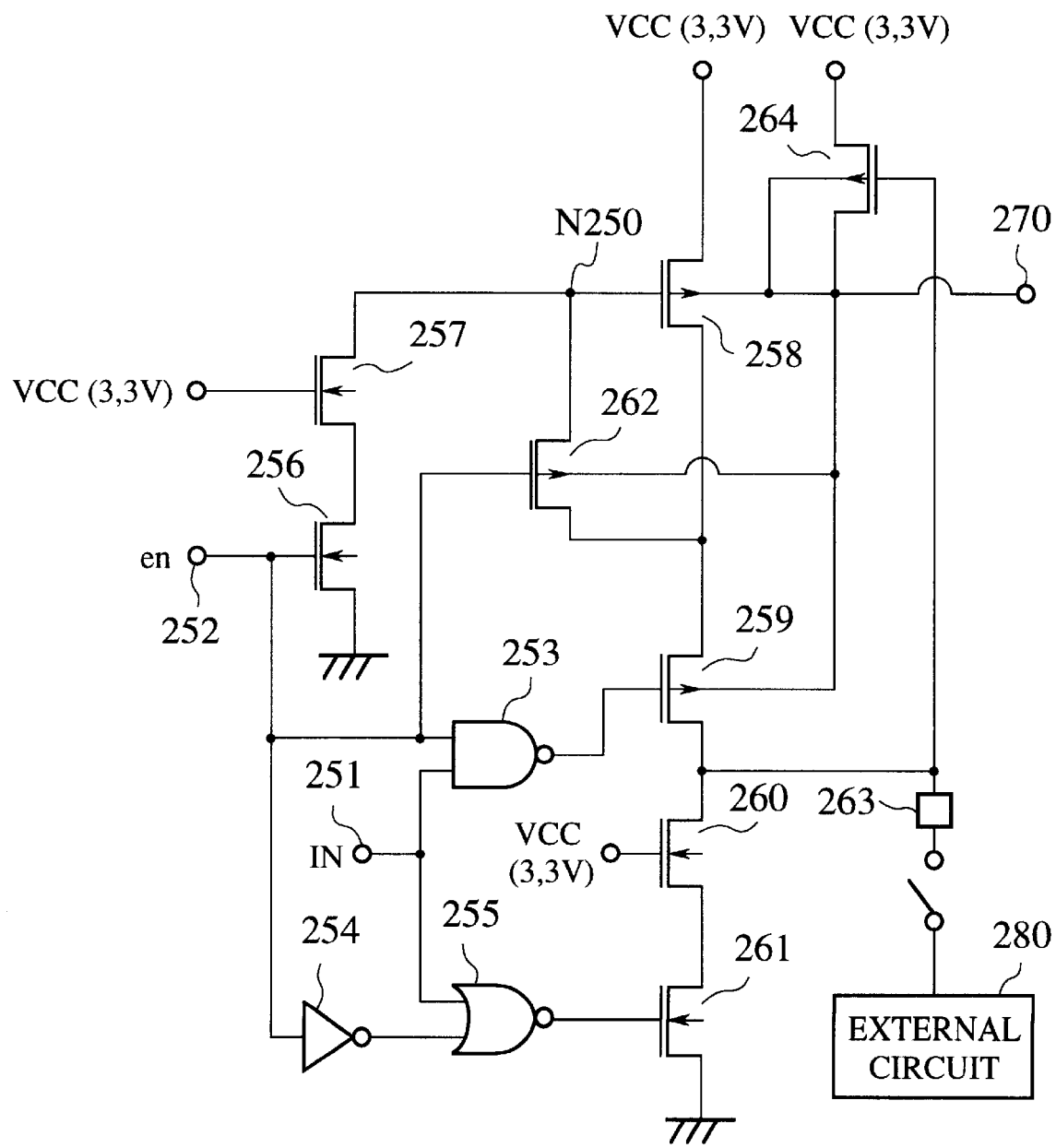
FIG. 3 shows a semiconductor output circuit according to the third prior art.

The operation of the first embodiment will be explained. If the output pad 4 has a voltage lower than 3 V provided by the power source VCC and if the nMOS 2c is ON, the node N3 is biased to a low voltage that is determined by subtracting a gate threshold voltage Vth of the nMOS 2c from the voltage at the output pad 4. The resistance of the resistor 2b is far greater than the ON resistance of the nMOS 2c. Then, a negative bias voltage $V_{gs}$ is applied to the gate and source of the pMOS 2a, to turn on the pMOS 2a. If 5 V is applied to the node N1 and to the gate of the pull-up nMOS 3, the nMOS 3 turns on to establish a pull-up state. This increases to 3 V of the 4 to 3 V of the power source VCC. The gate of the nMOS 3 is deeply biased by 5 V, which is higher than the gate threshold voltage Vth thereof, to increase the output capability of the nMOS 3 to about 3.6 V. (Here, the sum of the intrinsic gate threshold voltage Vth of the nMOS 3 and a voltage drop due to a back gate effect is 1.4 V.) Accordingly, the first embodiment realizes greater current supply capability than the first prior art of FIG. 1.

If the output pad 4 receives 5 V from an external circuit through the bus line 10 in the pull-up state, the node N2 is biased to about 3.6 V due to the voltage drops attributable to the intrinsic gate threshold and back gate effect. "The back gate effect" will be explained. When the output pad 4, i.e., the potential at drain of the nMOS 3 increases to 5 V, the gate of the nMOS 3 receives 5 V. Electrons in an n-type region (drain) of the nMOS 3 and holes in a p-type region (substrate) of the nMOS 3 move toward the respective electrodes, to expand a depletion layer width extending from a boundary between the n- and p-type regions. The enlarged depletion layer width causes a voltage drop. This is the back gate effect. Regarding the voltage drop by the intrinsic gate threshold voltage, the increment of the potential at the source of the nMOS 3 (node N2) is limited to about 3.6 V even if the drain thereof receives 5 V.

At this time, the nMOS 2c receives 5 V at the gate and drain thereof and enters the same bias state as the nMOS 3 is in. Accordingly, the node N3 is biased to about 3.6 V. As a result, no negative bias voltage $V_{gs}$ is applied to the gate and source of the pMOS 2a to turn on the pMOS 2a. Namely, the gate of the pMOS 2a is biased positively to turn off the pMOS 2a. This blocks a reverse current flowing from the output pad 4 to the power source VCC through the pMOS 2a.

Unlike the first prior art, the first embodiment employs no depletion type (D-type) transistors, and therefore, needs no additional processes such as a threshold voltage control technique by a channel doping ion implantation method. Accordingly, it is simple and quick to manufacture the high-speed, high-driving-capability semiconductor devices by the semiconductor output circuit of the first embodiment serving as an interface between LSI chips operating with 5 V and 3 V supply voltages.

The reverse current prevention circuit of FIG. 4C of the first embodiment is simply fabricated with a pMOS, a pull-down circuit, and an nMOS. This circuit correctly operates with a high latch-up immunity.

Second Embodiment

Figure 5A:
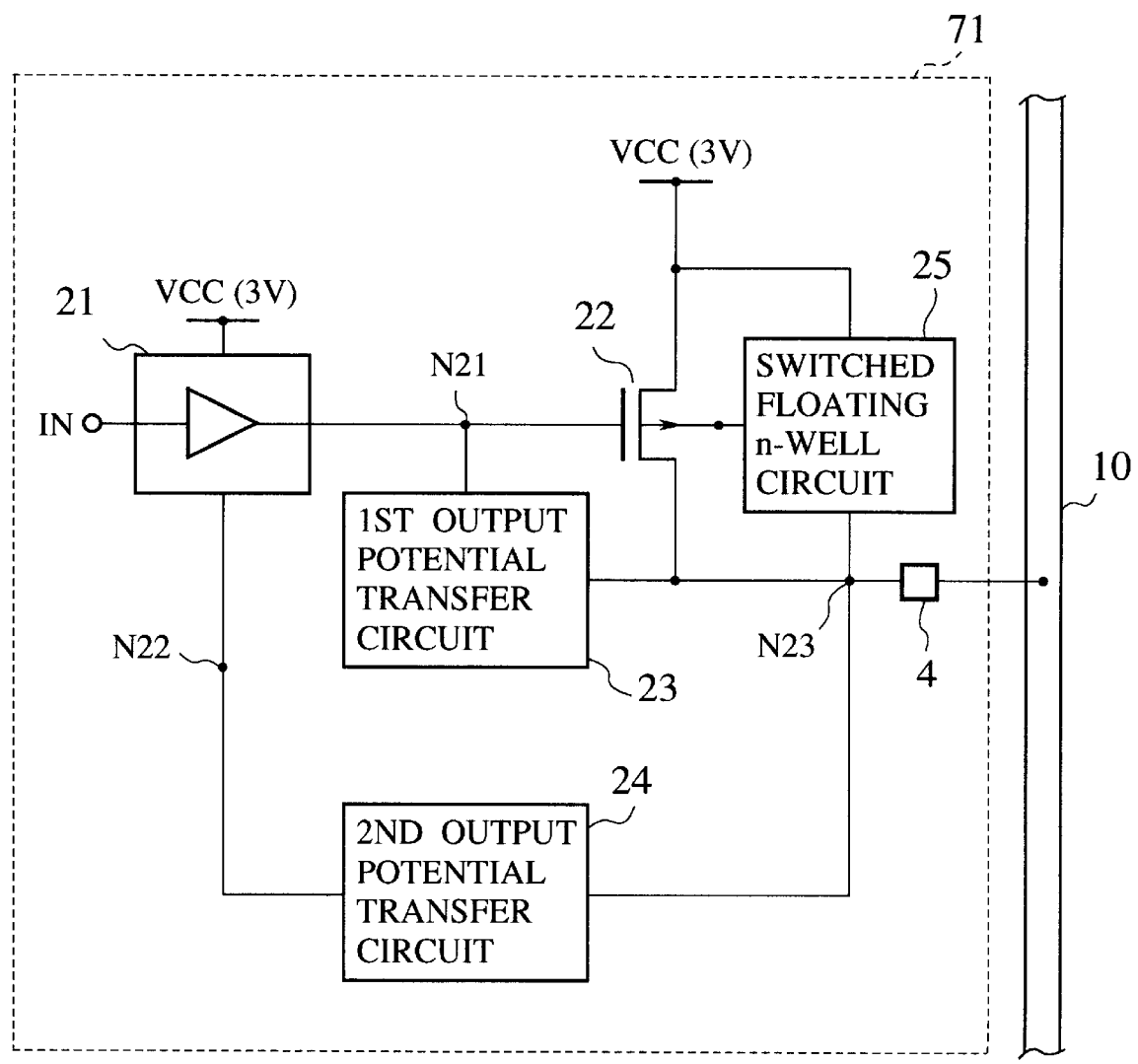
FIG. 5A shows a semiconductor output circuit according to a second embodiment of the present invention.

FIG. 5A shows a semiconductor output circuit 71 serving as an interface circuit according to the second embodiment of the present invention. The circuit 71 is a 5-V-tolerant, 3-V-output circuit merged in an LSI to provide a low-voltage output signal in the range of 0 V to 3 V and is connectable to an external circuit operating with a high supply voltage of 5 V bia an external 5-V bus 10. Whole circuit elements in the circuit 71 operate with a low supply voltage of 3 V alone. A pre-buffer 21 is connected to a low-voltage power source VCC of 3 V and provides a voltage in the range of 0 V to 3 V in response to an input voltage IN. The output of the pre-buffer 21 is connected to a node N21. The pre-buffer 21 is of a tri-state type, and the output thereof is enabled or disabled according to a voltage at a node N22.

Figure 5B:
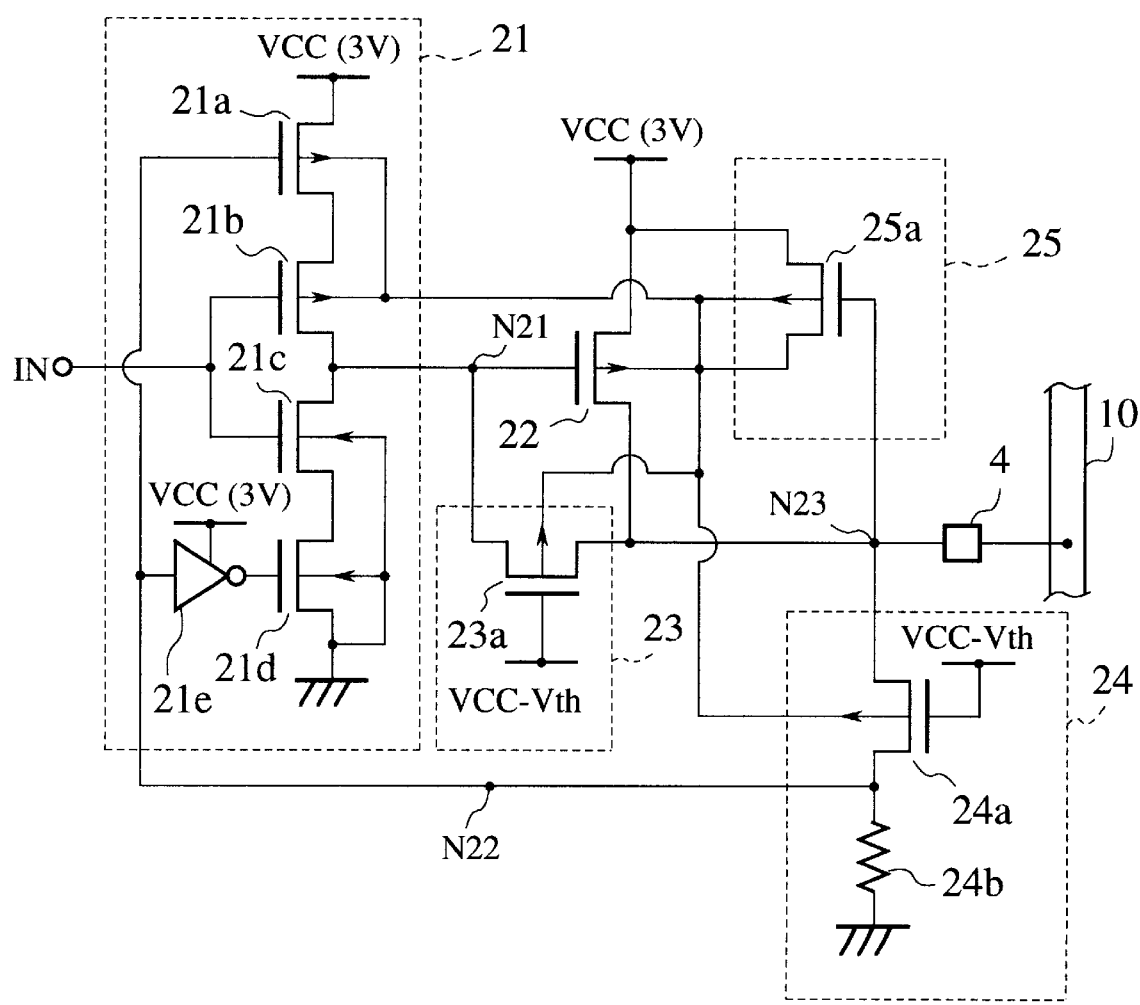
FIG. 5B shows first and second output potential transfer circuits and a switched floating n-well circuit contained in the circuit of FIG. 5A.

An output stage circuit of the circuit 71 will be explained. A pull-up pMOS 22 has a source electrode connected to the power source VCC, a drain electrode connected to a node N23, and a gate connected to the node N21. Between the nodes N21 and N23, a first output potential transfer circuit 23 is formed to transfer a voltage at the node N23 to the gate of the pull-up pMOS 22 when the voltage at the node N23 is higher than 3 V. The transfer circuit 23 has a pMOS whose gate receives a voltage of "VCC–Vth" where VCC is a supply voltage of 3 V and Vth is a gate threshold voltage of the pMOS. Between the nodes N23 and N22, a second output potential transfer circuit 24 is formed to transfer a voltage at the node N23 as a first signal to the node N22 if the voltage at the node N23 is higher than a reference level, namely 3 V. The node N23 is connected to an output pad 4, which is connected to the 5-V bus line 10. And the 5-V bus line 10 is connected the external circuit operating with the high supply voltage of 5 V. The node N23 is further connected to a switched floating n-well circuit 25. The switched floating n-well circuit 25 biases the substrate, i.e., n-well region of the pull-up pMOS 22 to a low voltage of 3 V when the node N23 is lower than a predetermined voltage, i.e., 3 V. If the node N23 is higher than the predetermined voltage (3 V), the switched floating n-well circuit 25 biases the n-well of the pull-up pMOS 22 to a floating state. FIG. 5A shows only a part of wiring extending from the switched floating n-well circuit 25, and some of the wirings are omitted. FIG. 5B shows the details of the tri-state pre-buffer 21, first and second transfer circuits 23 and 24, switched floating n-well circuit 25 and the omitted wirings connected to the switched floating n-well circuit 25. The pre-buffer 21 has pMOSs 21a and 21b and nMOSs 21c and 21d that are connected in series between the power source VCC and the ground. A node between the pMOS 21b and the nMOS 21c is connected to the node N21. The gates of the pMOS 21b and nMOS 21c commonly receive the input voltage IN. The output of the second transfer circuit 24 is connected to the gate of the pMOS 21a through the node N22, and to the gate of the nMOS 21d through an inverter 21e. The first transfer circuit 23 has the pMOS 23a, which is formed between and connected to the nodes N21 and N23. The gate of the pMOS 23a receives a voltage of "VCC–Vth" where VCC is 3 V and Vth is the gate threshold voltage of the pMOS.

The second transfer circuit 24 consists of a pMOS 24a and a resistor 24b, which are connected in series between the node N23 and the ground. A node between the pMOS 24a and the resistor 24b is an output terminal for providing the first signal and is connected to the node N22. The gate of the pMOS 24a receives a voltage of "VCC–Vth" where VCC is 3 V and Vth is a pMOS gate threshold voltage. The resistance of the resistor 24b sufficiently greater than the ON resistance of the pMOS 24a.

The switched floating n-well circuit 25 consists of a pMOS 25a having a source connected to the power source VCC and a substrate and drain commonly connected to the substrates of the pMOSs 21a, 21b, 22, 23a, and 24a. Similar to the first embodiment, the term "substrate" is a nominal substrate used to explain the equivalent circuit and is not always equal to a real substrate of an actual semiconductor chip. It may correspond to a well in the actual semiconductor chip. This is also true in the following third embodiment.

A pull-up operation of the circuit 71 shown in FIG. 5B with the input voltage IN representing "1" will be explained. The pre-buffer 21 operates as a CMOS inverter to provide the node N21 with "0" (0 V). Hence, a negative bias voltage $V_{gs}$ is applied to the gate and source of the pull-up pMOS 22, to turn on the pMOS 22. Then, the output pad 4 provides the low-voltage output signal of "1" (3 V) corresponding to the voltage of the power source VCC. If the output pad 4, i.e., the node N23 has a voltage lower than "VCC–Vth" where VCC is 3 V and Vth is the pMOS gate threshold voltage, the pMOS 25a is turned on. As a result, the voltage of the power source VCC is supplied to the substrates, i.e., n-wells of the pMOSs 21a, 21b, 22, 23a, and 24a. The pMOSs 23a and 24a are OFF, and the potential of the node N22 is decreased to ground potential of 0 V by a discharge through register 24b. This results in turning on the pMOS 21a and nMOS 21d. Consequently, the pre-buffer 21 operates as a normal CMOS inverter.

If 5 V is applied to the output pad 4 from the external circuit operating with 5 V supply voltage through the bus line 10 in the pull-up state, the drain (p-type region) and n-well region of the pull-up pMOS 22 form a forward biased pn diode, to bias the n-well of the pMOS 22 to about 4.3 V. At this time, the pMOS 25a is off state to pass no reverse current to the power source VCC. The gate of the pMOS 23a is biased to "VCC–Vth" to turn on the pMOS 23a, to transfer the voltage at the output pad 4 to the node N21, which is biased to 5 V. This turns off the pMOS 22 to pass no reverse current to the power source VCC.

At this time, the node N21 at the output of the pre-buffer 21 is forcibly biased to 5 V. This may cause a risk of passing a reverse current to the low-voltage power source VCC (3 V) through the pre-buffer 21. This risk is eliminated by the pMOS 24a of the second transfer circuit 24. When the output pad 4 is at 5 V, the pMOS 24a is turned on to equalize the voltage of the node N22 to that of the output pad 4 or that of the node N21. This turns off the nMOS 21d and pMOS 21a of the pre-buffer 21, to put the pre-buffer 21 in a high-impedance state. Accordingly, no reverse current flows from the node N21 to the low-voltage power source VCC through the pre-buffer 21. The high-impedance state is released when the output pad 4 drops below 3 V, and therefore, a normal operation is never hindered.

Figure 5C:
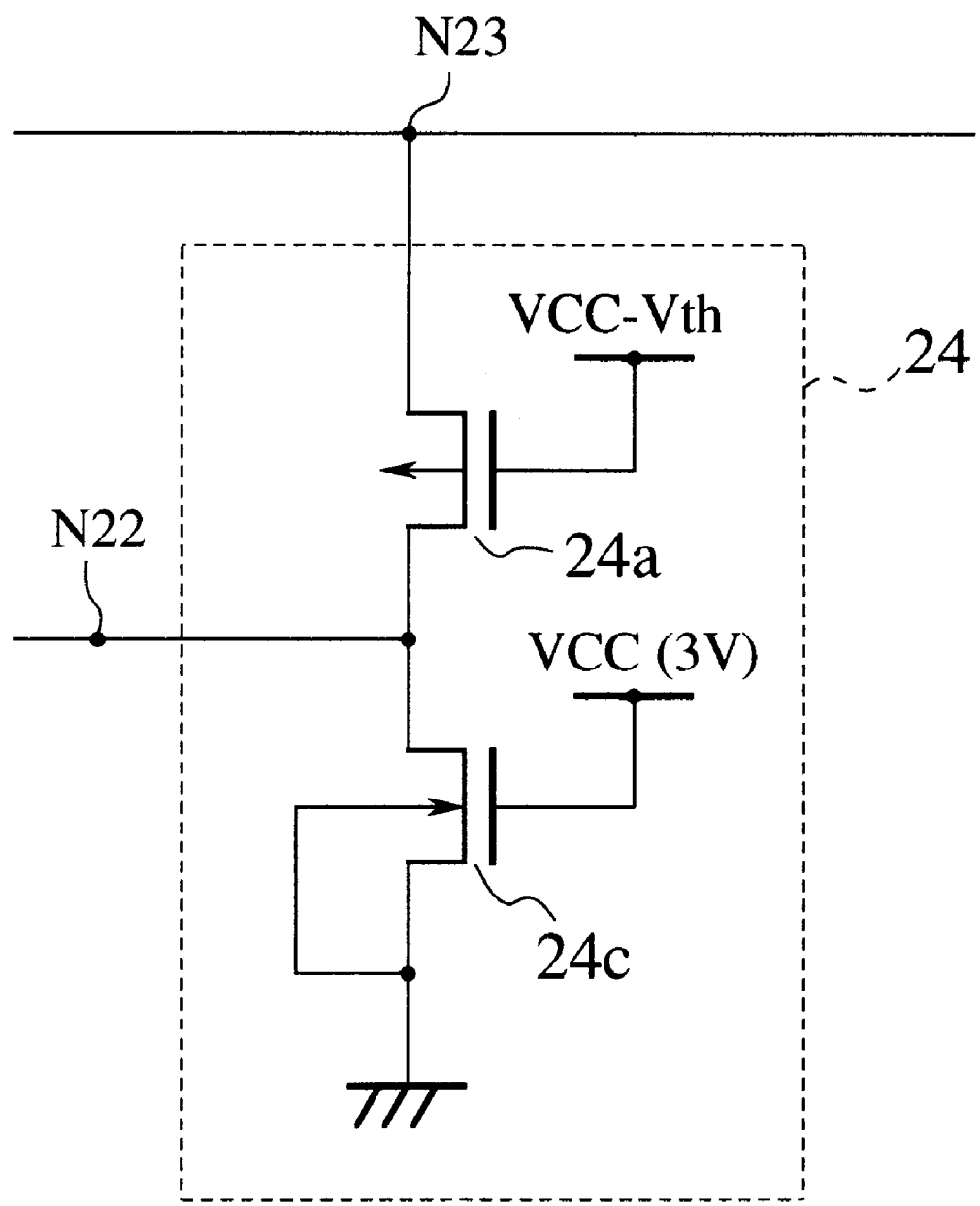
FIG. 5C shows a modification of the second transfer circuit 24 of FIG. 5A.

Although the gate voltage of each of the pMOSs 23a and 24a is "VCC–Vth" in this embodiment, it may be optional. The means for decreasing the potential at the node N22 to GND (0 V) when the pMOS 24a is OFF is not limited to the resistor 24b. For example, an nMOS 24c may be connected to the pMOS 24a as shown in FIG. 5C. The nMOS 24c has a gate connected to the power source VCC and a source and substrate connected to the ground (GND).

Figure 6:
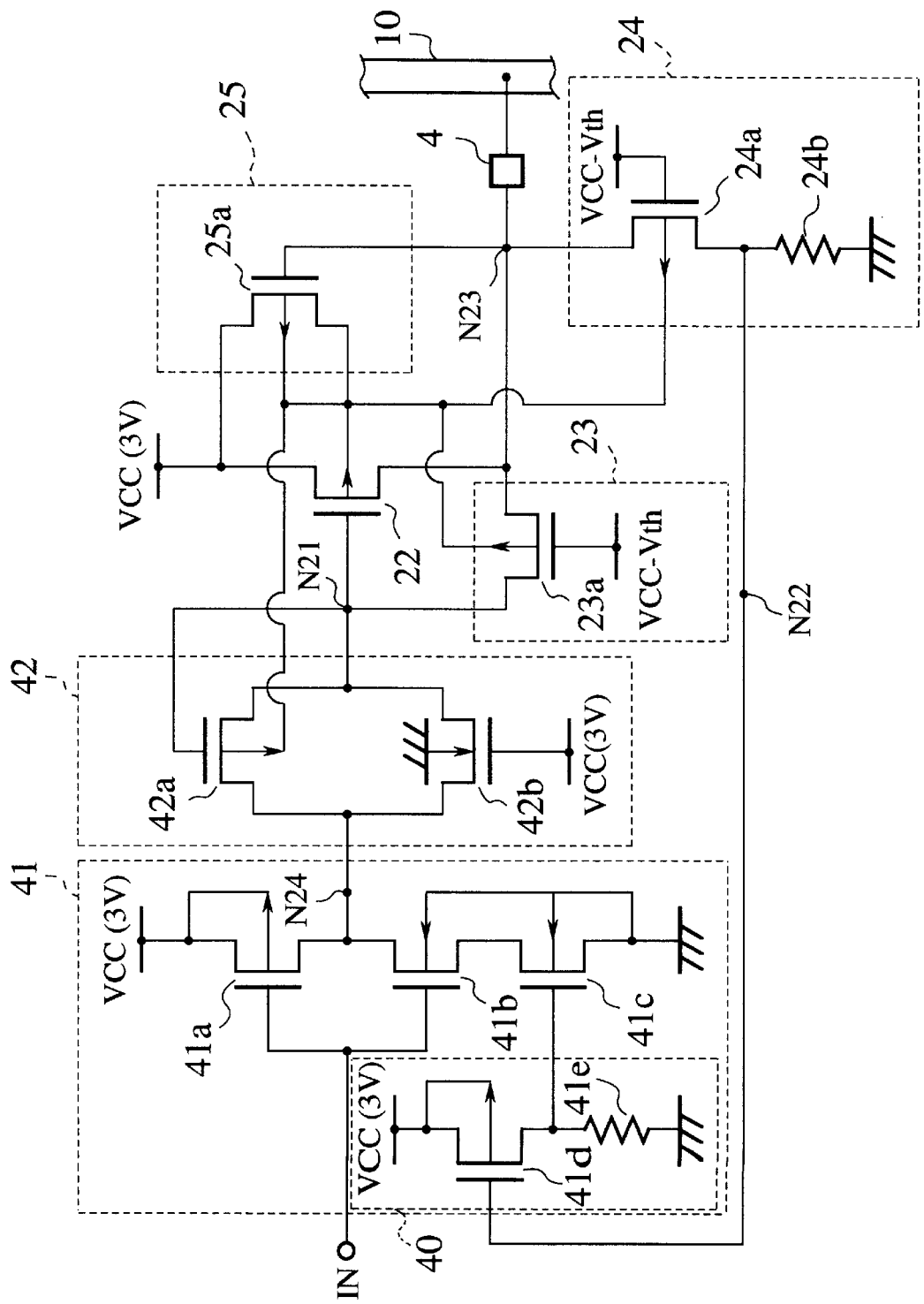
FIG. 6 shows a semiconductor output circuit according to a modification of the second embodiment of the present invention.

FIG. 6 shows a semiconductor output circuit according to a modification of the second embodiment of the present invention. This circuit operates on a single low supply voltage of 3 V and is made of only low-voltage devices (3-V devices), each of which is intolerable to 5 V, or the breakdown voltages between the gate and source, or gate and drain, or gate and substrate thereof are designed for 3 V operations. This circuit differs from that of FIG. 5B in that it has two pre-buffers. Namely, it has a first pre-buffer 41 and a second pre-buffer 42. The second prebuffer 42 is formed between nodes N24 and N21. The node N24 is connected to an output terminal of the first prebuffer 41. The other parts of FIG. 6 are the same as those of FIG. 5B. The first pre-buffer 41 consists of an inverter circuit and a voltage changer 40. The inverter circuit consists of a first pMOS 41a, a first nMOS 41b, and a second nMOS 41c, which are connected in series between a power source VCC of 3 V and a ground. The voltage changer 40 consists of a pMOS 41d and a resistor 41e. The pMOS 41a is formed between and connected to the power source VCC and an output node N24 and is turned on and off in response to an input voltage IN. The nMOSs 41b and 41c are connected in series between the output node N24 and the ground. The nMOS 41b is turned on and off in response to the input voltage IN complementary to the pMOS 41a. The nMOS 41c turns on and off in response to the output of the voltage changer 40. In the voltage changer 40, the pMOS 41d and resistor 41e are connected in series between the power source VCC and the ground, and a node between the pMOS 41d and the register 41e is connected to the gate of the nMOS 41c. The pMOS 41d turns on and off in response to a voltage at a node N22. The second pre-buffer 42 consists of a second pMOS 42a and a third nMOS 42b connected in parallel between a node N21 and the node N24. The substrate (n-well) of the pMOS 42a is common to the substrates (n-wells) of pMOSs 22, 23a, 24a, and 25a and is connected to the drain of the pMOS 25a. The substrate of the nMOS 42b is connected to the ground.

The operation of the circuit of FIG. 6 will be explained. When a high voltage of 5 V is applied to the output pad 4 from an external circuit operating with high supply voltage of 5 V through bus 10, the pMOS 23a is turned on to bias the node N21 to 5 V. Then the potential at the node 21 causes the pMOS 42a of the second pre-buffer 42 to turn off (or maintain the off state, if being turned off already). If the node N24 represents "0," the nMOS 42b will turn on. Due to the back gate effect of the nMOS 42b, the voltage of the node N24 is about 3 V at the most. The high voltage of 5 V at the output pad 4 turns on the pMOS 24a to provide the node N22 with a first signal of "1" (5 V). The voltage changer 40 inverts the first signal to "0" to turn off the nMOS 41c of the first pre-buffer 41. As a result, no current flows from the node N24 to the ground. Since the voltage at the node N24 is about 3 V at the most, no current flows from the node N24 to the power source VCC. Through these operations, no voltage above 3 V is applied to the gate and source, or gate and drain, or gate and substrate of any device contained in the circuit of FIG. 6.

When the first pre-buffer 41 provides "0," the nMOS 42b in the second pre-buffer 42 works. When the node N21 is "0" and the first pre-buffer 41 provides "1," the pMOS 42a in the second pre-buffer 42 works. Accordingly, the circuit of FIG. 6 operates correctly.

The second embodiment and the modification thereof fabricate a semiconductor output circuit only with low-voltage transistors, to simplify the manufacturing processes thereof.

Third Embodiment

Figure 7A:
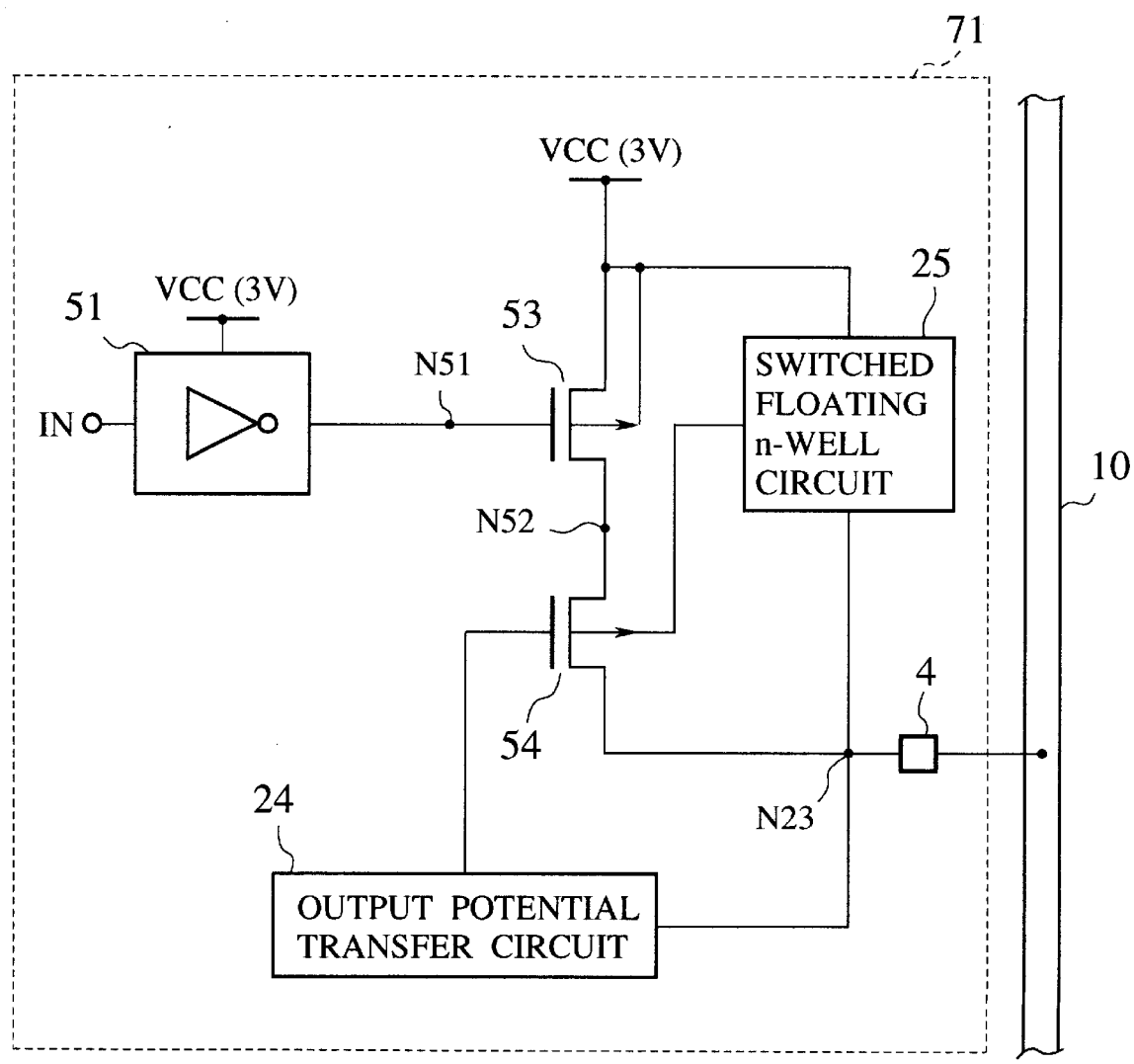
FIG. 7A shows a semiconductor output circuit according to a third embodiment of the present invention.

FIG. 7A shows a semiconductor output circuit 71 serving as an interface circuit according to the third embodiment of the present invention. This is the interface circuit merged in a 5-V-tolerant, 3-V-output LSI connectable to an external circuit operating with 5 V supply voltage bia an external 5-V bus 10. This circuit operates on a single low voltage of 3 V and is made of only 3-V devices fabricated according to low-voltage processes. A pre-buffer 51 is connected to a power source VCC of 3 V and provides a voltage in the range of 0 V to 3 V according to an input voltage IN. The output of the pre-buffer 51 is connected to a node N51. An output stage circuit consists of a pull-up pMOS 53 and a reverse current prevention pMOS 54, which are connected in series between the power source VCC and an output pad 4. The gate of the pull-up pMOS 53 is connected to the node N51. An output potential transfer circuit 24 is arranged between the output pad 4 and the gate of the prevention pMOS 54. The transfer circuit 24 transfers a voltage at the output pad 4 to the gate of the prevention pMOS 54 when the voltage at the output pad 4 is higher than a reference level, namely, 3 V. The output pad 4 is connected to a switched floating n-well circuit 25. The switched floating n-well circuit 25 biases the n-wells (substrates) of the pMOSs 53 and 54 to a low voltage of 3 V if the output pad 4 is below a predetermined voltage (3 V), and to a floating state if the output pad 4 is above the predetermined voltage (3 V). The output pad 4 is connected to the 5-V bus line 10.

Figure 7B:
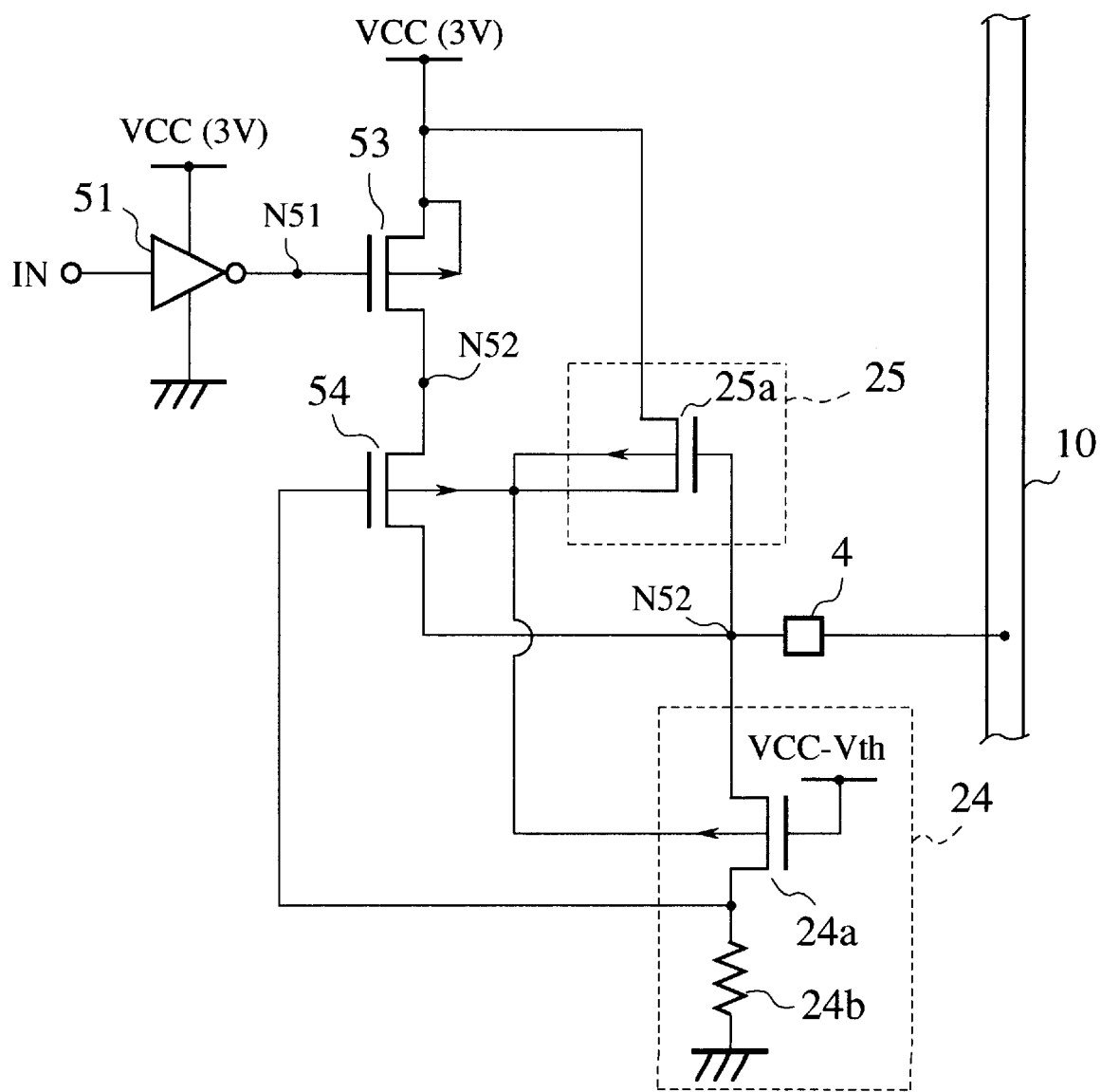
FIG. 7B shows an output potential transfer circuit and a switched floating n-well circuit contained in the circuit of FIG. 7A.

FIG. 7B shows the details of the transfer circuit 24 and the switched floating n-well circuit 25. The transfer circuit 24 consists of a pMOS 24a and a resistor 24b, which are connected in series between the output pad 4 and the ground. A node between the pMOS 24a and the resistor 24b forms an output terminal of the transfer circuit 24 and is connected to the gate of the prevention pMOS 54. The gate of the pMOS 24a receives a voltage of "VCC–Vth" where VCC is 3 V and Vth is a pMOS gate threshold voltage. The switched floating n-well circuit 25 consists of a pMOS 25a having a source connected to the power source VCC. And an n-well (substrate) of the pMOS 25a is connected to a drain of itself as well as to the n-wells of the other pMOSs 54 and 24a.

A pull-up operation of the circuit of FIG. 7B will be explained. When the pMOS 24a is OFF and a signal corresponding to "0" is applied to the node N51 from the pre-buffer 51, the pMOS 53 turns on. When the pMOS 24a is OFF, the transfer circuit 24 provides the gate of the pMOS 54 with a signal of "0" to turn on the pMOS 54. Accordingly, a voltage at the output pad 4 is equalized to 3 V of the power source VCC.

On the contrary, if 5 V is applied to the output pad 4 during the pull-up operation, the pMOS 25a turns off. Accordingly, the substrate (n-well region) of the pMOS 54 becomes a floating state. And no reverse current flows through a forward biased pn diode formed in the pMOS 54 to the power source VCC. In this case, the high voltage of 5 V at the output pad 4 turns on the pMOS 24a to apply the high voltage at the output pad 4 to the gate electrode of the pMOS 54, to turn off the pMOS 54. Accordingly, no reverse current flows from the output pad 4 to the power source VCC during the pull-up operation. A voltage greater than 3 V is never applied to the gate and source, or gate and drain, or gate and substrate of any transistor in the circuit 71.

As explained above, the semiconductor output circuit according to the third embodiment blocks a reverse current flowing from the output pad to the low-voltage power source when a high voltage is applied to the output pad. This circuit is manufacturable at low cost without additional processes or a special structural design. The output circuit operates on a single low voltage and serves as a high-speed, high-driving-capability interface circuit that simultaneously deals with high and low supply voltages.

Fourth Embodiment

Figure 8:
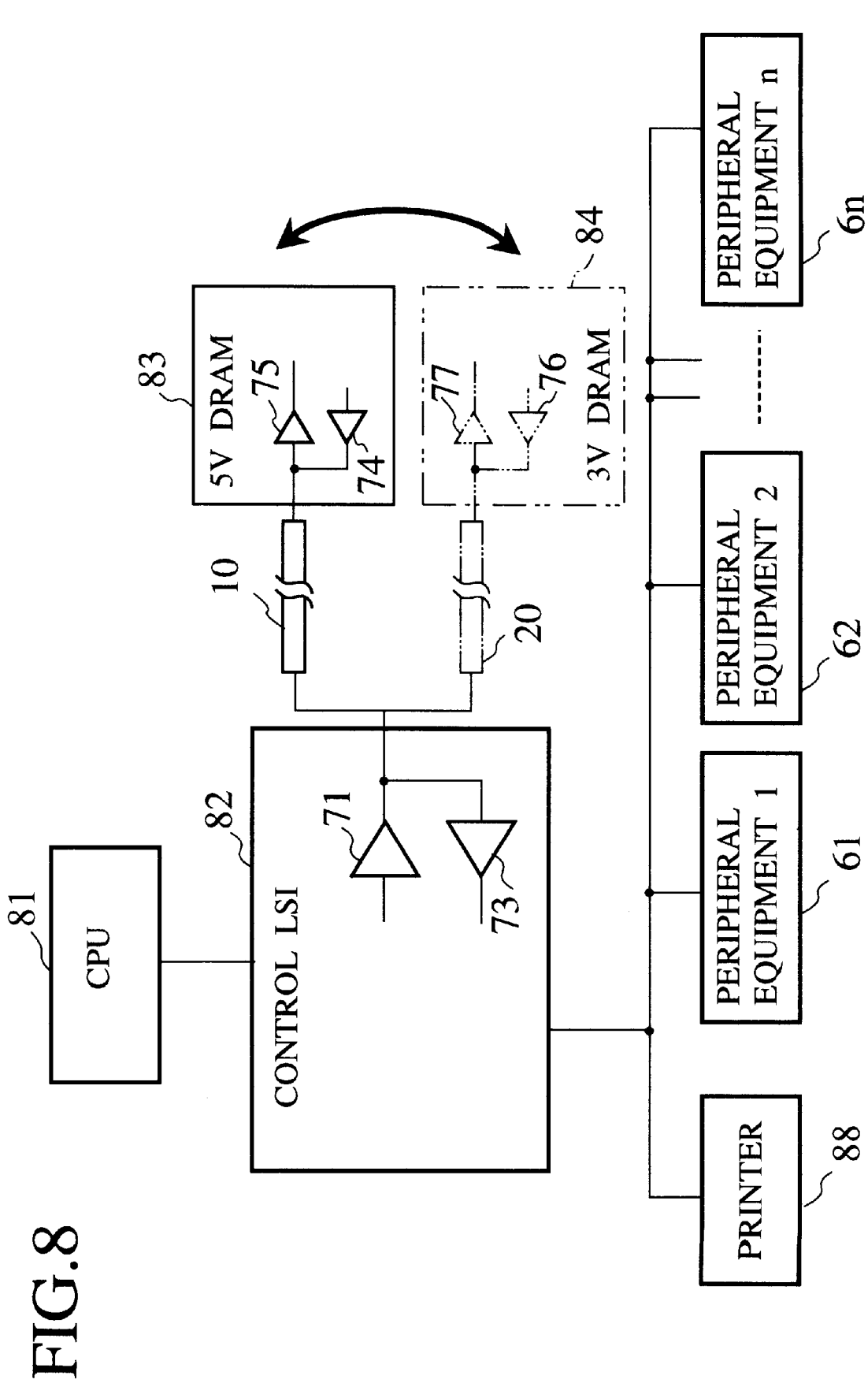
FIG. 8 shows a mother board of a personal computer according to a fourth embodiment of the present invention.

FIG. 8 shows a system organization for a mother board of a personal computer according to the fourth embodiment of the present invention. In the personal computer, a CPU 81 is connected to a control LSI 82, which is connected to a 5-V DRAM 83, a printer 88, and peripheral equipment 61 to 6n. The control LSI 82 is a 3-V LSI having a semiconductor output circuit 71 and a semiconductor input circuit 73. The circuit 71 is based on any one of the first to third embodiments and the modification of the second embodiment of the present invention. The circuit 71 is connected to the 5-V DRAM 83 through a 5-V bus 10. As indicated with a two-dot-one-dash line, the 5-V DRAM 83 may be replaced with a 3-V DRAM 84. Namely, the fourth embodiment enables the 5- and 3-V memories to be selected optionally, to make system designing more flexible. The fourth embodiment can adopt any combination of a control LSI and a memory without regard to supply voltages thereof, to realize required performance. The 5-V DRAM 83 has a semiconductor output circuit 74 and a semiconductor input circuit 75. The 3-V DRAM 84 has a semiconductor output circuit 76 and a semiconductor input circuit 77. The output circuit 76 of the 3-V DRAM 84 may be formed according to any one of the first to third embodiments of the present invention, so that the 3-V DRAM is combined with a 5-V control LSI. In this way, the present invention improves the degree of freedom of system designing and quickly copes with a change in LSI specifications during a migration period going from high supply voltage to lower supply voltages, where LSIs having different operating voltages are mixed and used. The present invention is effective to quickly improve the performance of a system such as a personal computer system.

Figure 9:
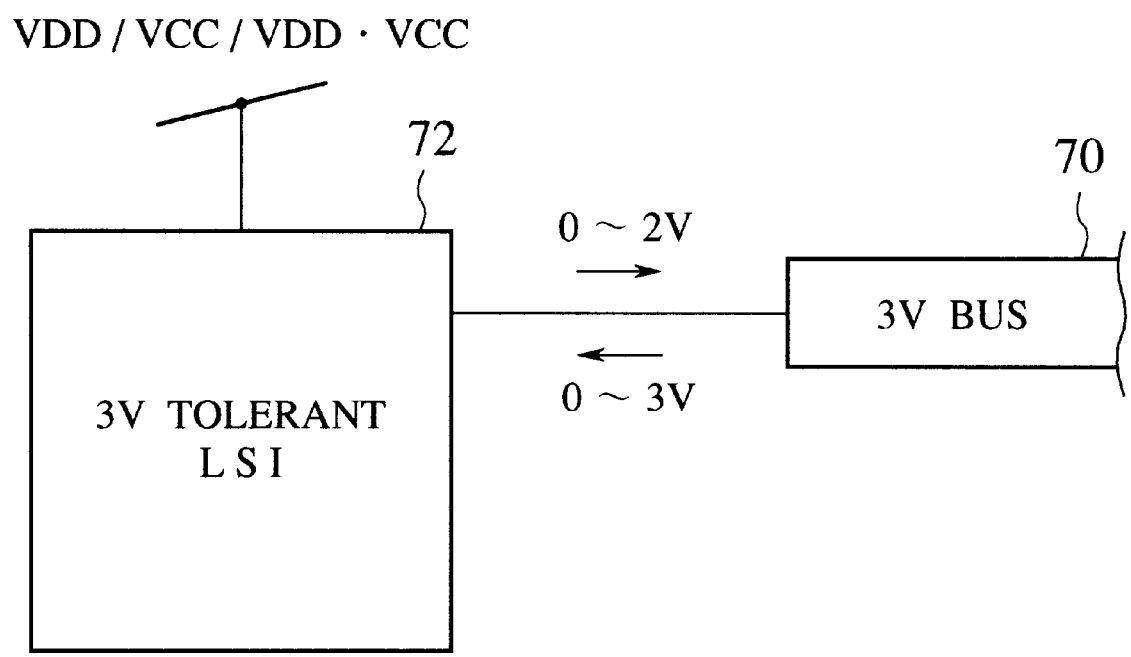
FIG. 9 schematically shows a 3-V-tolerant, 2-V-output LSI according to the present invention.

Various modifications will become possible for those skilled in the art after receiving the teachings of the present disclosure without departing from the scope thereof. The first to third embodiments of the present invention provide each a 5-V-tolerant, 3-V-output semiconductor output circuit that provides an output signal in the range of 0 V to 3 V and has output pins connectable to an external 5-V bus. This does not limit the present invention. The present invention is able to deal with any other supply voltage combination. For example, FIG. 9 shows a 3-V-tolerant, 2-V-output circuit 72 according to the present invention. This circuit provides a low-voltage output signal in the range of 0 V to 2 V and has output pins connectable to an external 3-V bus 70. Similarly, the system of FIG. 8 may have any other voltage combination. For example, it may employ a 3-V control LSI that is connectable to a 3-V DRAM as well as to a 2-V DRAM. And the output circuit of the present invention is further applicable to the migration period going from 2-V to 1-V and below.

What is claimed is:

1. An interface circuit for providing a low-voltage output signal, connected to an external circuit that operates on a high supply voltage, the interface circuit having a pull-up p-channel MOS transistor formed between and connected to an output pad and a low-voltage power source, the output pad being connected to the external circuit, the pull-up transistor being turned on and off in response to an input voltage applied to a gate electrode of the pull-up transistor and providing the low-voltage signal according to a low supply voltage provided by the low-voltage power source, the interface circuit further comprising:

an output potential transfer circuit for providing a first signal if a voltage at the output pad is higher than a reference level;

a reverse current prevention p-channel MOS transistor having a first main electrode connected to the pull-up transistor, a second main electrode connected to the output pad, and a gate electrode only connected to the output potential transfer circuit to be turned on and off according to the first signal; and a switched floating n-well circuit for biasing a substrate of the reverse current prevention transistor to the low supply voltage if the voltage at the output pad is below a predetermined voltage, and to a floating state if the voltage at the output pad is above the predetermined voltage.

2. The interface circuit of claim 1, further comprising:

a pre-buffer connected to the gate electrode of said pull-up transistor.

3. An interface circuit for providing a low-voltage output signal, connected to an external circuit that operates on a high supply voltage, the interface circuit having a pull-up p-channel MOS transistor formed between and connected to an output pad and a low-voltage power source, the output Pad being connected to the external circuit, the pull-up transistor being turned on and off in response to an input voltage applied to a gate electrode of the pull-up transistor and providing the low-voltage signal according to a low supply voltage provided by the low-voltage power source, the interface circuit further comprising:

an output potential transfer circuit for providing a first signal if a voltage at the output pad is higher than a reference level, comprising:
 a p-channel MOS transistor having a first main electrode connected to said output pad, a second main electrode, and a gate electrode to receive a voltage of "Vcc–Vth", where Vcc is the low supply voltage provided by the low-voltage power source and Vth is a gate threshold voltage; and
 a resistor formed between and connected to the second main electrode of the p-channel MOS transistor and a ground;

a reverse current prevention p-channel MOS transistor formed between and connected to the pull-up transistor and the output pad to be turned on and off according to the first signal;

a switched floating n-well circuit for biasing a substrate of the reverse current prevention transistor to the low supply voltage if the voltage at the output pad is below a predetermined voltage, and to a floating state if the voltage at the output pad is above the predetermined voltage; and a prebuffer connected to the gate electrode of said pull-up transistor.

4. An interface circuit for providing a low-voltage output signal, connected to an external circuit that operates on a high supply voltage, the interface circuit having a pull-up p-channel MOS transistor formed between and connected to an output pad and a low-voltage power source, the output pad being connected to the external circuit, the pull-up transfer being turned on and off in response to an input voltage applied to a gate electrode of the pull-up transistor and providing the low-voltage signal according to a low supply voltage provided by the low-voltage power source, the interface circuit further comprising:

an output potential transfer circuit for providing a first signal if a voltage at the output pad is higher than a reference level;

a reverse current prevention p-channel MOS transistor formed between and connected to the pull-up transistor and the output pad, to be turned on and off according to the first signal;

a switched floating n-well circuit for biasing a substrate of the reverse current prevention transistor to the low supply voltage if the voltage at the output pad is below a predetermined value, and to a floating state if the voltage at the output pad is above the predetermined voltage, comprising a p-channel MOS transistor having a first main electrode connected to the low-voltage power source and a second main electrode and substrate both connected to a substrate of the reverse current prevention p-channel MOS transistor and to a substrate of said p-channel MOS transistor of the output potential transfer circuit; and a prebuffer connected to the gate electrode of said pull-up transistor.

5. A computer system comprising:

(a) a CPU;

(b) a memory operating on a high supply voltage provided by a high-voltage power source;

(c) a high-voltage bus connected to the memory;

(d) a control LSI connected to the CPU and high-voltage bus and operating on a low supply voltage provided by a low-voltage power source, the control LSI having an interface circuit comprising:
 an output pad connected to the high-voltage bus;
 a potential transfer circuit connected to the output pad;
 a prebuffer;
 a first p-channel MOS transistor having a first main electrode, a second main electrode connected to the low-voltage power source, and a gate electrode connected to an output of the prebuffer;
 a second p-channel MOS transistor having a first main electrode connected to the output pad, a second main electrode connected to the first main electrode of the first p-channel MOS transistor, and a gate electrode only connected to the potential transfer circuit; and
 a switched floating n-well circuit formed between and connected to the low-voltage power source and the output pad, to control a substrate voltage of the first and second p-channel MOS transistors; and (e) peripheral equipments connected to the control LSI.

* * * * *